United States Patent [19]

Butt

[11] 4,410,927

[45] Oct. 18, 1983

[54] CASING FOR AN ELECTRICAL COMPONENT HAVING IMPROVED STRENGTH AND HEAT TRANSFER CHARACTERISTICS

[75] Inventor: Sheldon H. Butt, Godfrey, Ill.

[73] Assignee: Olin Corporation, New Haven, Conn.

[21] Appl. No.: 390,095

[22] Filed: Jun. 21, 1982

Related U.S. Application Data

[63] Continuation-in-part of Ser. No. 341,392, Jan. 21, 1982.

[51] Int. Cl.³ ............................................. H05K 7/20
[52] U.S. Cl. .................................... 361/386; 357/81; 174/16 HS; 361/401; 361/403; 361/414
[58] Field of Search ............................ 361/386–389, 361/401, 403, 405, 407, 414, 421; 357/74, 81; 174/52 FP, 52 H, 16 HS

[56] References Cited

U.S. PATENT DOCUMENTS

| | | |
|---|---|---|
| 2,999,194 | 9/1961 | Boswell et al. |
| 3,113,252 | 12/1963 | Matea |
| 3,341,369 | 9/1967 | Caule et al. |
| 3,374,537 | 3/1968 | Doelp, Jr. .................... 361/421 |
| 3,469,017 | 9/1969 | Starger ........................ 361/386 |
| 3,480,836 | 11/1969 | Aronstein |
| 3,676,292 | 7/1972 | Pryor et al. |
| 3,739,232 | 6/1973 | Grossman .................... 361/401 |
| 3,740,920 | 6/1973 | Lane |
| 3,872,583 | 3/1975 | Beall et al. |
| 3,914,858 | 10/1975 | Sonoda et al. |
| 3,988,825 | 11/1976 | Fuchs et al. |
| 4,066,839 | 1/1978 | Cossutta et al. |
| 4,262,165 | 4/1981 | Ohwaki .................... 174/52 FP |
| 4,320,438 | 3/1982 | Ibrahim ...................... 361/401 |

OTHER PUBLICATIONS

IBM Tech. Discl. Bull. vol. 9, No. 11, Apr. 1967, p. 1511, Monolithic Chip Carrier, Betz-Ecker.

F. Neighbour and B. R. White, "Factors Governing Aluminum Interconnection Corrosion in Plastic Encapsulated Microelectronic Devices", *Microelectronics and Reliability*, Pergamon Press, Great Britain, vol. 16, 1977, pp. 161–164.

R. C. Olberg and J. L. Bozarth, "Factors Contributing to the Corrosion of the Aluminum Metal on Semiconductor Devices Packaged in Plastics", *Microelectronics and Reliability*, Pergamon Press, Great Britain, vol. 15, 1976, pp. 601–611.

*Primary Examiner*—G. P. Tolin
*Attorney, Agent, or Firm*—Howard M. Cohn; Barry L. Kelmachter; Paul Weinstein

[57] ABSTRACT

A casing for an electrical component comprises a metal base member. A metal housing member is mounted on the base member to provide a hollow enclosed casing for receiving the electrical component. A metal lead frame is provided within the enclosed casing and is electrically connected to the electrical component. The lead frame has terminal leads projecting between the base member and the housing member external to the casing. The improvement comprises a device extending from the base member for strengthening the base member and providing additional heat transfer from the casing. Also, an adhesive seals and bonds the terminal leads to both the base member and to the housing member to form the enclosed casing.

10 Claims, 5 Drawing Figures

CASING FOR AN ELECTRICAL COMPONENT HAVING IMPROVED STRENGTH AND HEAT TRANSFER CHARACTERISTICS

This application is a continuation-in-part of U.S. application Ser. No. 341,392, filed Jan. 21, 1982.

The present invention is to a process and apparatus for encasing a semiconductor and more particularly for providing a highly reliable metal casing which is sealed and bonded using an adhesive.

Presently, in the electronic industry there are basically two types of semiconductor packages used for most integrated circuits. One is the plastic molded package in which an electronic device, supported on a lead frame, is molded into or encapsulated in plastic. This plastic package has several reliability problems. Firstly, failures in the plastic to metal bond provide an avenue through which moisture and other contaminants can reach the electric device and cause corrosion failures. This problem has been more fully explained and documented in an article entitled "Factors Governing Aluminum Interconnection Corrosion in Plastic Encapsulated Microelectronic Devices" by Neighbour and White, published in *Microelectronics and Reliability*, by Pergamon Press in Great Britain, Vol. 16, 1977, pages 161–164.

Even when such failures do not occur, diffusion of contaminants through the plastic or perhaps arising as a result of gradual degradation of the plastic may cause failure. This type of failure has been described in an article entitled "Factors Contributing to the Corrosion of the Aluminum Metal on Semiconductor Devices Packaged in Plastics" by Olberg and Bozarth, published in *Microelectronics and Reliability*, by Pergamon Press in Great Britain, Vol. 15, 1976, pages 601–611.

In another type of package, two pieces of alumina ceramic are glass sealed to the lead frame with a suitable solder glass to form a hermetic ceramic dual in-line package (CERDIP). The CERDIP package avoids the problems associated with the plastic molded package. However, it is much more costly.

Another technique known in the art is to enclose a semiconductor device in a metal package and to hermetically seal the package using cold pressure welding. This method of hermetically sealing an electrical component in a metal housing is taught in U.S. Pat. No. 2,999,194 to Boswell et al. and in U.S. Pat. No. 3,988,825 to Fuchs et al.

It is also known in the prior art to provide a hermetically sealed enclosure for an electronic device which is fabricated without the use of heat. This concept has been disclosed in U.S. Pat. No. 3,113,252 to Matea.

Adhesives have been used in the art to bond semiconductor packages as taught in U.S. Pat. No. 3,740,920 to Lane and in U.S. Pat. No. 3,914,858 to Sonoda et al.

It is a problem underlying the present invention to provide a package for an electrical component which has high reliability without the cost associated with completely hermetically sealed packages.

It is an advantage of the present invention to provide a casing for an electrical component which obviates one or more of the limitations and disadvantages of the described prior arrangements.

It is a further advantage of the present invention to provide a casing for an electrical component which is substantially resistant to the diffusion of contaminants.

It is a yet further advantage of the present invention to provide a casing for an electrical component which is relatively inexpensive to manufacture.

It is a still yet further advantage of the present invention to provide a casing for an electrical component which may be assembled without the use of heat.

Accordingly, there has been provided a casing for an electrical component comprising a metal base member. A metal housing member is mounted on the base member to provide a hollow enclosed casing for receiving the electrical component. A metal lead frame is provided within the enclosed casing and is electrically connected to the electrical component. The lead frame has permanent leads projecting between the base member and the housing member external to the casing. The improvement comprises an element extending from the base member for strengthening the base member and providing additional heat transfer from the casing. Also, an adhesive seals and bonds the terminal leads to both the base member and to the housing member to form the enclosed casing.

The invention and further developments of the invention are now elucidated by means of the preferred embodiments shown in the drawings.

Figure 1:
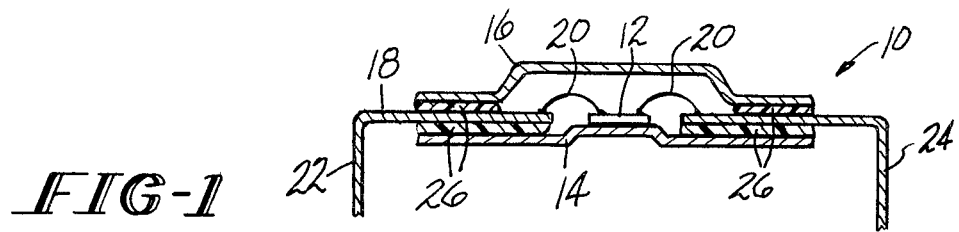
FIG. 1 is a cross section of a casing for an electrical component in accordance with the present invention.

Referring to FIG. 1, there is illustrated a casing 10 for an electrical component 12. The casing comprises a metal base member 14. A metal housing member 16 is mounted upon the base member 14 to provide a hollow enclosed casing for receiving the electrical component. A metal lead frame 18 within the enclosed casing is electrically connected by wires 20 to the electrical component. The lead frame 18 has terminal leads 22 and 24 projecting between the base member 14 and the housing member 16 external to the casing 10. The improvement comprises an adhesive 26 for sealing and bonding the terminal leads to both the base member and to the housing member to form the enclosed casing.

The package for sealing an electrical component such as a semiconductor element comprises a metal base member 14 of any desired shape and thickness. The semiconductor element or chip 12 may be mounted on the bottom member using an epoxy adhesive as in any conventional plastic encapsulated package. The bottom surface of lead frame 18 is sealed and bonded to the bottom member 14 using an epoxy adhesive 26. An electrical connection between the chip 12 and the lead frame is made by wires 20 in a conventional manner. Then, the housing member 16 is sealed and bonded to the top surface of the lead frame using epoxy 26.

As seen in FIG. 1, the terminal leads 22 and 24 project between the base member and the housing member external to the casing 10. Although the terminal leads preferably protrude from all sides of the casing, it is within the scope of the present invention for the terminal leads to extend from any number of sides. There may be surface areas between the housing member 10 and base member 14 which are in contact with each other. Then, the adhesive provided between these surface areas would bond and seal them together. The housing member may be shaped to form a hollow enclosure as shown so as to not interfere with the chip or electrical wires 20. However, the exact shape of the casing 10 does not form a part of the present invention and may be any shape as desired.

The metal used for the base member, the housing member, and the lead frame may be of any desired metal or alloy which bonds strongly with an adhesive. However, in accordance with this invention, it has been found that copper and copper base alloys having a refractory oxide layer provide very strong bonds with different adhesives and thereby prevent diffusion of contaminants between the epoxy and the metal substrate. Suitable copper base alloys for use in the present invention contain from 2 to 12% aluminum. In particular, CDA alloy 638, as disclosed in U.S. Pat. No. 3,676,292 to Pryor et al., containing 2.5 to 3.1% aluminum, 1.5 to 2.1% silicon, and 0.25 to 0.55% cobalt is most useful in the provision of a metal in accordance with this invention. Impurities may be present which do not prevent bonding in a desired environment. Further, it may be desirable to use CDA alloy 6381, as disclosed in U.S. Pat. No. 3,341,369 to Caule et al. Alloy 6381 is similar to alloy 638 except for the omission of cobalt. This omission reduces cost and entails some reduction in annealed mechanical properties.

The alloys useful with this invention and, especially alloys 638 or 6381, have a refractory oxide layer applied to the surface which is in contact with the adhesive. The oxide layer may include complex oxides formed with elements such as alumina, silica, tin, iron chromia, zinc, and manganese. Most preferably, the refractory oxide layer is substantially aluminum oxide ($Al_2O_3$). This refractory oxide may be applied to the substrate in any desired mamner. For example, a copper base alloy such as alloy 638 is preoxidized in gases having an extremely low oxygen content. The alloy 638 may be placed in a container with 4% hydrogen and 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy. It is also within the scope of the invention to apply the refractory oxide layer to the entire surface of each element in contact with the epoxy.

The advantage of using alloy 638 with a pre-oxidized surface is that it bonds well to adhesives, such as epoxies, and is, therefore, substantially impervious to the diffusion of contaminants between the epoxy and the metal substrate. Also, the preoxidized surface is an excellent barrier to any contaminants passing directly through the metal. Thus, the casing of the present invention has reduced the potential for interdiffusion of contaminants since the majority of the package is metal and the interdiffusion can substantially only occur in the relatively thin layer of adhesive which seals the package.

The present invention uses any adhesive 26 such as an epoxy which provides a strong bond with any metal or alloy and preferably with a metal or alloy having a refractory oxide surface layer such as preoxidized 638 or 6381.

A number of different adhesives have been found to bond and seal the refractory oxide layers together. Several examples are provided in the chart below.

|    | Type | Name | Manufacturer |
|----|------|------|--------------|
| a. | 2 part room temperature structural epoxy | Bondmaster M688 | National Adhesives Co. |
| b. | 1 part thermosetting encapsulating epoxy | Morton 410B | Morton Chemical Co. |
| c. | thermoplastic polyphenoline sulfide | Philips Ryton | Philips Petroleum |

The substrate 14 provides the primary strength and stiffness to the package. Generally, the substrate is formed of alloy 638 or 6381 as mentioned above. Further, it is often necessary to provide heat dissipation through the substrate. In that case, the heat dissipation may be improved by cladding the 638 or 6381 with another alloy such as copper alloy 151 to provide greatly increased thermal conductivity. It is also within the scope of the present invention to clad any other metal or metal alloy with desired characteristics to a metal or alloy having a refractory oxide layer on at least one surface.

Since there may be a substantial mismatch between the coefficient of thermal expansion of the copper alloy substrate and that of the chip 12, it may be necessary to mount the chip upon the substrate using a high temperature adhesive such as for example a polyimide.

Figure 2:
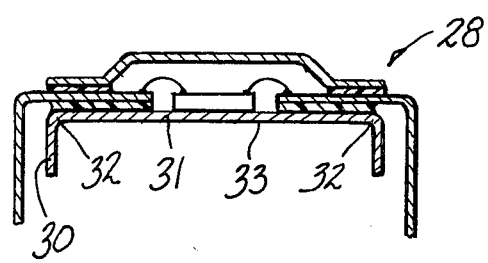
FIG. 2 is a cross section of a casing with a skirted substrate.

FIG. 2 is an illustration of a second embodiment 28 of the present invention which is similar to the embodiment of FIG. 1. A peripheral skirt 30 has been added to the base member or substrate 31. Skirt 30 may extend transversely out of the plane of the base member from the corners 32 of substrate 31 at any desirable angle and preferably at approximately 90 degrees from the bottom surface 33 of the substrate 31. The skirt imparts additional strength and stiffness to substrate 31. The stiffening effect of the skirt may permit a substantial reduction in the thickness of the substrate and thereby provide a source of cost reduction. The skirt 30 also enhances the thermal dissipation of the substrate by providing additional heat transfer surface to increase convective heat transfer to the air or environment.

Figure 3:
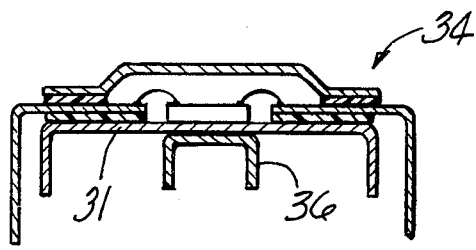
FIG. 3 is a cross section of a casing with a skirted substrate with cooling fins.

Referring to FIG. 3, there is illustrated on embodiment 34 of the present invention, similar to the embodiment of FIG. 2, but with additional cooling fins 36. The fins may be constructed of a strip or several strips of preferably high thermal conductivity alloy such as alloy 151 and joined to the bottom surface of substrate 31 by any conventional manner such as soldering. Although the fins are illustrated as being a strip of material bent into a U-shaped configuration, it is within the scope of the present invention to provide any number of cooling fins formed from any number of strips of material with each being of any desirable shape.

Figure 4:
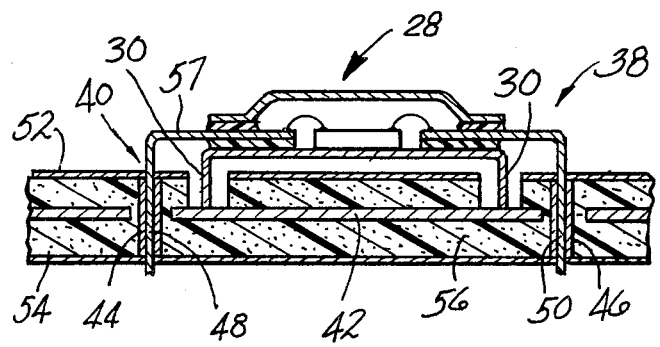
FIG. 4 is a cross section of a casing with a skirted substrate contacting a heat sink in a printed circuit board.

FIG. 4 illustrates an embodiment 38 where a semiconductor casing 28 having a skirted substrate, substantially identical as with the embodiment of FIG. 2, is joined to a printed circuit board 40 having a buried heat sink/ground plates 42 extending there through. The circuit board may be conventionally constructed from a metal or alloy layers 52 and 54 and bonded together by a material 56 such as a conventional organic epoxy. The ground plate 42 may be made of any material preferably having high thermal and electrical conductivity. The printed circuit board 40 includes through-holes 44 and 46 to receive the ends 48 and 50, respectively, of the lead frame 57. The through-holes may be plated so as to receive solder and join the outer layers 52 and 54. The skirt 30 may be placed in contact with the heat sink/ground plate 42 to enhance the heat dissipation from the package. Preferably, the skirt is joined to the plate 42 by any desired means such as solder.

Figure 5:
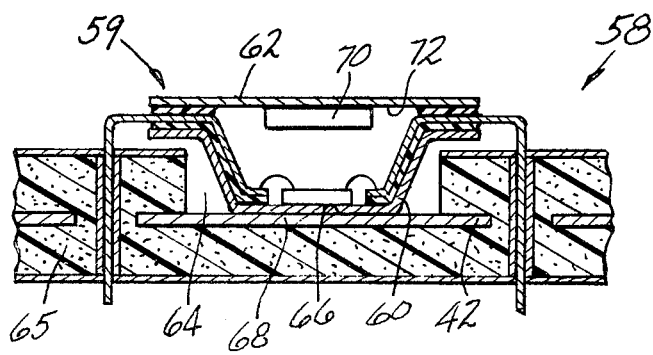
FIG. 5 is a cross section of a casing with a drop center substrate contacting a heat sink in a printed circuit board.

FIG. 5 illustrates another embodiment 58 of the present invention wherein a casing 59 includes a dropped center substrate 60. The substrate may be formed by deep drawing the material of the substrate by any conventional means such as stamping. In this embodiment, the cover 62 may be substantially flat since the space required for the chip is provided by the shaped substrate. A hollow section 64 in the printed circuit board 65 permits a portion or area 66 of the substrate 60 to be joined, by any conventional means such as soldering, directly to a heat sink/ground plate 68 which is buried within the printed circuit board. The coefficient of thermal expansion of the substrate may be chosen to closely match that of the heat sink/ground plate 68. Thus, difficulties which might arise out of a mismatch of the coefficient of thermal expansion and in particular in the large joining area 66 are substantially eliminated.

Referring again to FIG. 5, a layer 70 of moisture or contaminate absorbing material may be affixed to the internal surface 72 of lid 62 so as to scavenge water vapor and/or other contaminants which may diffuse into the package. This layer may consist of materials such as silica gel, activated carbon, etc., or mixtures of such materials. The material may be affixed to any conventional manner such as by an adhesive or placement in a container and affixing the container to the surface 72. Although this option is illustrated in FIG. 5, it may also be applied to any embodiments provided herein and in any semiconductor package. Also, the material may be affixed to any desired inner surface.

It is apparent that there has been provided in accordance with this invention a casing for an electrical component and a method of forming the component which fully satisfies the objects, means, and advantages set forth hereinabove. While the invention has been described in combination with the specific embodiments thereof, it is evident that many alternatives, modifications, and variations will be apparent to those skilled in the art in light of the foregoing description. Accordingly, it is intended to embrace all such alternatives, modifications, and variations as fall within the broad scope of the appended claims.

I claim:

1. In a casing for an electrical component comprising:
a metal base member;
a metal housing member being mounted upon said base member to provide a hollow enclosed casing for receiving said electrical component;
a metal lead frame within said enclosed casing for electrical connection to said electrical component, said lead frame having terminal leads projecting between said base member and said housing member external to said casing, the improvement comprising:
skirt means extending outwardly from at least two opposite edges of said base member and transversely out of the plane of the base member and beyond said hollow enclosed casing for strengthening said base member and providing additional heat transfer from said casing; and
adhesive means sealing and bonding said terminal leads to both said base member and to said housing member whereby said enclosed casing is formed.

2. The casing as in claim 1 wherein said skirt means extends substantially perpendicular from said at least two opposite edges.

3. The casing as in claim 1 further including fin means for cooling said casing, said fin means being adjoined to the bottom surface of said base member.

4. A circuit board structure comprising:
a circuit board;
a casing for an electrical component being connected to said circuit board;
said casing for an electrical component comprising:
a metal or alloy base member;
a metal or alloy housing member being mounted upon said base member to provide a hollow enclosed casing for receiving said electrical component; and
a metal or alloy lead frame within said enclosed casing for connection to said electrical component;
said lead frame having terminal leads projecting between said base member and said housing member external to said casing;
said circuit board comprising:
a first metal or alloy component;
a second metal or alloy component;
means bonding said first and second components together;
a heat sink plate embedded in said bonding means;
a cavity extending from said heat sink plate and receiving said base member; and
a portion of an outer surface of said base member being received in said cavity and joined to said plate.

5. The casing as in claim 4 wherein said outer surface of said base member is soldered to said plate.

6. The casing as in claim 4 wherein said skirt means extends substantially perpendicular from said at least two opposite edges.

7. The structure as in claim 5 further including adhesive means sealing and bonding said terminal leads to both said base member and to said housing member to form said enclosed casing.

8. The casing as defined in claims 1 or 4 further including absorption means within said enclosed casing for absorbing contaminants.

9. In a casing for an electrical component comprising:
a metal base member;
a metal housing member being mounted upon said base member to provide a hollow enclosed casing for receiving said electrical component;
a metal lead frame within said enclosed casing for electrical connection to said electrical component, said lead frame having terminal leads projecting between said base member and said housing member external to said casing, the improvement comprising:
skirt means extending from at least two opposite edges of said base member beyond said hollow enclosed casing for strengthening said base member and providing additional heat transfer from said casing;
adhesive means sealing and bonding said terminal leads to both said base member and to said housing member whereby said enclosed casing is formed; and a printed circuit board having a first metal or alloy component, a second metal or alloy component, means bonding said first and second components together, a heat sink plate embedded in said bonding means, and at least one cavity extending from said heat sink plate and receiving said extending means whereby said extending means can be joined to said heat sink plate.

10. The casing as in claim 9 wherein said skirt means extends substantially perpendicular from said at least two opposite edges.

* * * * *